CIRCUIT FOR TUNING INDICATION IN A RECEIVER FOR AM/FM-RECEPTION

Filed Jan. 7, 1963 2 Sheets-Sheet 1

INVENTOR
LEOPOLD KRAMMER
BY Frank R. Trifari
AGENT

INVENTOR
LEOPOLD KRAMMER
BY
Frank R. Jifani
AGENT

United States Patent Office 3,249,872
Patented May 3, 1966

3,249,872

CIRCUIT FOR TUNING INDICATION IN A RECEIVER FOR AM/FM-RECEPTION

Leopold Krammer, Vienna, Austria, assignor to North American Philips Company, Inc., New York, N.Y., a corporation of Delaware Filed Jan. 7, 1963, Ser. No. 249,827
Claims priority, application Germany, Jan. 13, 1962, N 21,063; July 20, 1962, N 21,875
11 Claims. (Cl. 325—317)

This invention relates to circuits for tuning indication in receivers and more particularly to transistor receivers adapted for AM/FM-reception. Such receivers are provided with means for the automatic volume control of at least one high-frequency or intermediate-frequency amplifying stage when AM signals are being received.

In transistor receivers, the required direct operating supply voltage is always so low that the use of a tuning indicator tube (magic eye) is impossible. It is not economical to provide a direct voltage source of the required high voltage merely for the tuning indicator tube. If the transistor receiver is designed for both AM- and FM-reception, the use of a tuning indicator involves additional difficulty, since the voltages at the points suitable for deriving a control signal for the tuning indicator differ greatly and hence a tuning indictaor device which is active in the same manner for both kinds of operation is possible only if means are provided for switching the indicator. Such switching in itself involves difficulty due to the occurrence of additional couplings.

According to the invention a current-indicating instrument for tuning indication is permanently connected in both the direct-current circuit or circuits of the transistor or transistors which are automatic volume controlled in AM-reception, and a direct-current circuit of the FM-detector.

The invention is based upon recognition of the fact that the use of a current-indicating instrument permits the omission of AM/FM-commutation of the tuning indicator device in a simple manner. In FM-reception, when amplification control does not occur, the FM-detector delivers a direct current which varies with tuning. In AM-reception the direct current output of the FM detector is zero and the variation in the direct-current flow of an automatic volume controlled transistor is used for the tuning indication. In either kind of reception, the index of the instrument, so long as no signal is present or the receiver is not tuned to a transmitter, occupies a rest position which is determined by the direct current of the automatic gain controlled transistors in the absence of control signals. The index starts from this rest position, even though in AM-reception, the direct current of the transistors is increased or decreased by the control. During FM-reception the direct current output of the FM-detector becomes additionally active in one direction or the other.

When use is made of an indicating instrument having only one current coil, then in FM-reception, the direct current of the transistor (which has automatic volume control in AM-reception only) causes a voltage drop across the current coil of the indicating instrument so that the diodes of the FM-detector are biased. This bias is dependent upon the manner in which the diodes are connected, in the conducting or the blocking direction. If the indicating instrument has a low internal resistance the voltage drop across it is maintained low, and the operation of the FM-detector is not affected. However, if the voltage drop across the indicating instrument is sufficiently large that the sensitivity of the FM-detector decreases, then the voltage set up via the internal resistance of the instrument may be compensated by an inverse voltage in the FM-detector. It is possible, for example, to provide a separate voltage source for producing this inverse voltage. However, it is preferably produced by means of a potentiometer which is fed by the supply voltage of the receiver.

According to a second solution for avoiding a biasing potential set up across the FM-detector during FM-reception an instrument having two windings is provided for tuning indication. The direct current (currents) or the corresponding voltage of the transistor (transistors) controlled in AM-reception are supplied to one winding and the other winding is connected in the direct-current circuit of the FM-detector.

The instrument is preferably included in the direct-current circuit of the FM-detector so that one terminal thereof is connected to earth.

In another embodiment of the invention, it is possible for the currents flowing through the instrument, that is to say the maximum direct current of the FM-detector and the current from the direct-current circuit of the transistor which has automatic volume control during AM-reception, to be made equal to one another when no control signal is applied to the transistor. For this purpose, only part of the direct current of the transistor controlled in AM-reception or only part of the direct current of the FM-detector is supplied to the indicating instrument by means of resistors included in the current circuits and providing for the division of the current. The portion of current from the direct-current circuit of the transistor controlled in AM-reception, when in the non-controlled condition, is approximately equal to the portion originating from the direct current of the FM-detector which occurs for a maximum amplitude of the signal. Due to this step, the deflections of the instruments for maximum signals are the same in AM- and FM-reception. By suitable connection of the diodes of the FM-detector, the current variations which occur upon variation in the amplitude of the signal are preferably chosen so that they act upon the indicating instrument in the same sense in both AM- and FM-reception, which is very desirable for the user of the apparatus.

In order that the invention may be readily carried into effect, it will now be described in detail, by way of example, with reference to the accompanying drawings, in which.

Figure 1:
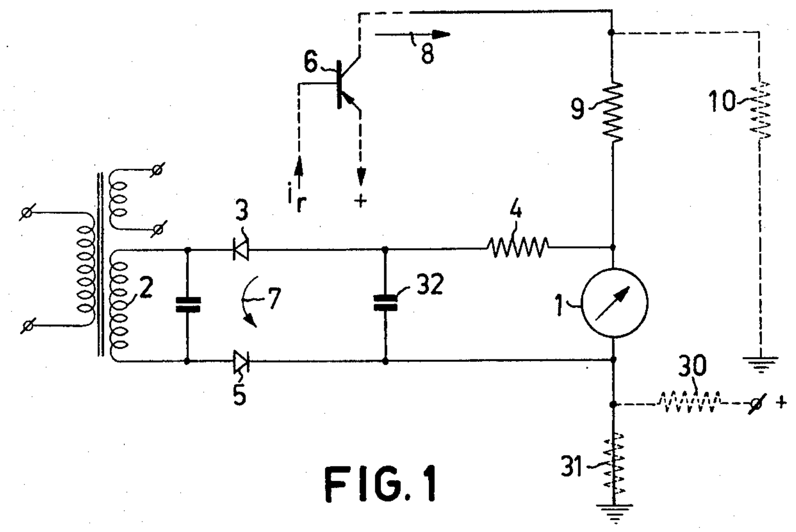
FIG. 1 shows a circuit diagram of an indicating circuit according to the invention, in which all superfluous details are omitted.

FIG. 1 shows the circuit of a tuning indicator device according to the invention in which a current-indicating instrument 1 having only one pair of terminals and preferably only one indicating winding, is included in both the direct-current circuit of an FM-detector and the direct-current circuit of a transistor 6. The FM-detector comprises a (tuned) winding 2, a diode 3, a load resistor 4 and a diode 5. The transistor 6 is automatic volume-controlled in AM-reception and is not controlled in FM-reception. This transistor is used in both kinds of reception, for example for intermediate-frequency amplification, as will be described in greater detail with reference to FIG. 3. In the circuit of FIG. 1, all superfluous details such as, for example, the uncoupling for the low-frequency signals or the production of the control magnitude for the control of transistor 6 or the connection of the tertiary winding into the FM-detector, are not shown.

The direction of the direct current 7 of the FM-detector relative to that of the direct current 8 of the transistor is chosen so that the two currents flow through the instrument 1 in opposite directions. It is thus achieved that in FM-reception, the direct current 7 is subtracted from the current 8. The direct current 8 is constant in this mode of reception, and hence the indication on the instrument approaches the zero value as the amplitude of the FM-signal increases. If in AM-reception, when the FM-detector does not deliver direct current, the direct current 8 of the transistor is, for example, controlled downwards upon increasing signal, the tuning indication takes place in the same direction as in FM-reception. Resistors 9 and 10 may introduce a division of the current in the direct-current circuit of the transistor so that the portion of the direct-current of this circuit which flows through the instrument 1 has the same value as the direct current in the FM-detector for a maximum FM-signal. In this example of the invention, the indication decreases to zero or an approximately equal final value for maximum signals in both AM- and FM-reception. It is assumed that the current 8 is greater than the maximum direct current in the FM-detector when automatic volume control signals are not applied to the transistor 6. If this is not the case, the division of the current must of course be carried out in the direct-current circuits of the FM-detector instead of in that of the transistor 6. Of course it is also possible to have division of current in either current circuit to match a given instrument.

With the directions of current chosen in the circuit diagram of FIG. 1, the portion of the direct current which flows through resistor 9 does not all flow through the instrument 1, but part of it also flows through resistor 4, diode 3, winding 2 and diode 5, since the diodes 3 and 5 are biased in the conducting direction for this direction of current due to the voltage across the instrument 1. The amplitude of this current portion is determined substantially by the value of the load resistor 4 of the FM-detector relative to the resistance of the instrument. As is well-known, the direct-current biasing load on the FM-detector influences the operation thereof, so that the current which flows through the circuit of the FM-detector must not be excessive. Otherwise the function of the diodes is disturbed, so that both the sensitivity and the AM-suppression could become worse. By suitable choice of the internal resistance of the instrument, the influence on the FM-detector may be minimized so that the latter is not unfavourably affected.

Figure 2:
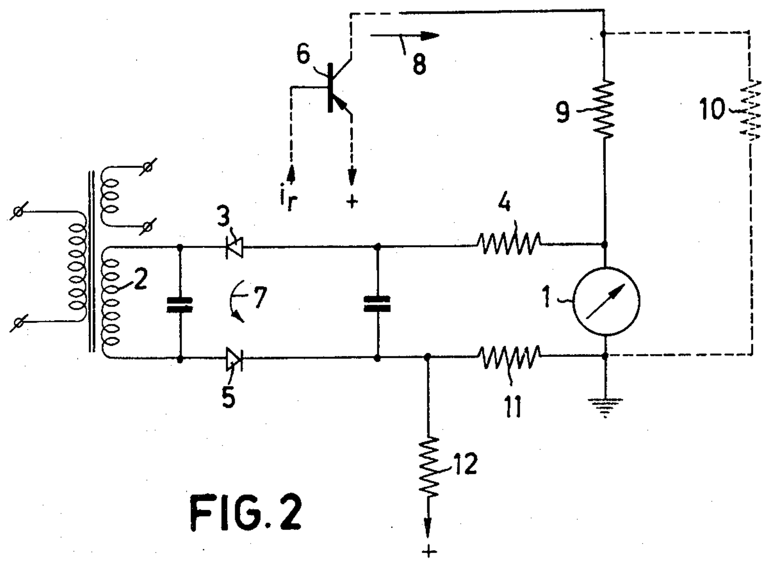
FIG. 2 shows a modification of the circuit of FIG. 1.

To avoid the disadvantage of requiring an instrument of a very low ohmic value, it is possible, as in the arrangement shown in FIG. 2, to introduce a compensation of the voltage biasing the diodes. In this arrangement the diode circuit 5 of the FM-detector includes a resistor 11 of which the end not connected to ground is connected through a resistor 12 to the positive supply voltage lead. If the value of resistor 12 is chosen to be such that the voltage across resistor 11 is equal to the voltage which appears across the indicating instrument due to the current flowing through resistor 9 when the transistor 6 is not controlled, no current flows through the diodes 3 and 5. By suitable choice of resistor 12, any arbitrary extent of compensation may be provided, for example such that a low current still flows through the diodes 3 and 5, or the diodes are slightly biased in the cut-off direction.

When such compensation is used in an asymmetrical FM-detector, as shown in FIG. 2, the resistor 11, in order not ot disturb the asymmetry, is preferably given a low value.

The FM-detector 2 to 5 delivers a direct current 7 which is substantially zero in the absence of an FM-input signal and which reaches a maximum value if the input signal has a maximum amplitude. The current of transistor 6, which is controlled only in AM-reception, has in the absence of an AM-input signal, an initial value which is varied by the control to a value which is considerably higher or preferably considerably smaller. However, transistor 6 is usually not cut-off completely in any controlled condition so that a certain current 8 always flows through the instrument 1 and hence its limiting indications during operation are distinguished from the rest condition when the apparatus is inoperative.

This may be desirable in order to provide an indication of whether or not the apparatus is in operation. For this purpose it is possible to provide on the scale of the instrument 1, in the rest position which is valid for the apparatus switched off, a coloured point, for example of a red fluorescent point, which is covered by a small disc provided on the index, when the apparatus is inoperative and no current flows in the instrument 1.

However, it may also be desirable for an initial value of the control range governed by the current 8, preferably the value which applies in the absence of an input signal, to be shifted to a final value of the scale of the instrument 1 so that the complete range of the instrument 1 is governed by the variation in the current 8. Such a shift may be obtained if a division of current by means of resistor 10 to earth is provided and if the instrument 1 is connected to a point, of constant potential which is equal to the potential set up at the other input terminal of the indicating instrument if an AM-input signal is absent or has a maximum amplitude. In the circuit shown in FIG. 1, this may be achieved, for example, by connecting a potentiometer 30, 31 in parallel with the supply source.

If transistor 6 amplifies high-frequency or intermediate-frequency oscillations, and a direct-current load for signal amplification is not required in its output circuit, for example in the collector branch or the emitter branch, the resistor 9 may be wholly dispensed with, or be limited to a value which is necessary for carrying out a division of current by means of resistor 10 without increasing thereby the damping of the instrument 1 in an impermissible manner.

Preferably, the total active resistance present in parallel across the indicating instrument is, for the natural frequency of the instrument 1, approximately equal to the aperiodic damping resistance for the instrument 1. This parallel resistance is formed, for example, by resistor 4 in series with the impedance of a capacitor 32 of the FM-detector and, in parallel therewith, the series-combination of the resistors 9 and 10, it possibly being necessary also to take into account the impedance of a smoothing capacitor connected to the common point of said resistors relative to ground.

It is to be noted that similar conditions occur if, instead of a current-indicating instrument, an indicating instrument is used which is sensitive to preferably low voltages and has a correspondingly higher internal resistance. In this case, the required matching may be obtained in a similar manner as by means of the resistors 9 and 10 in FIG. 1.

It is to be noted that the invention may be carried out not only in combination with an asymmertical FM-detector, but also in a similar manner with a symmetrical FM-detector or with any other type of FM-detector.

Figure 3:
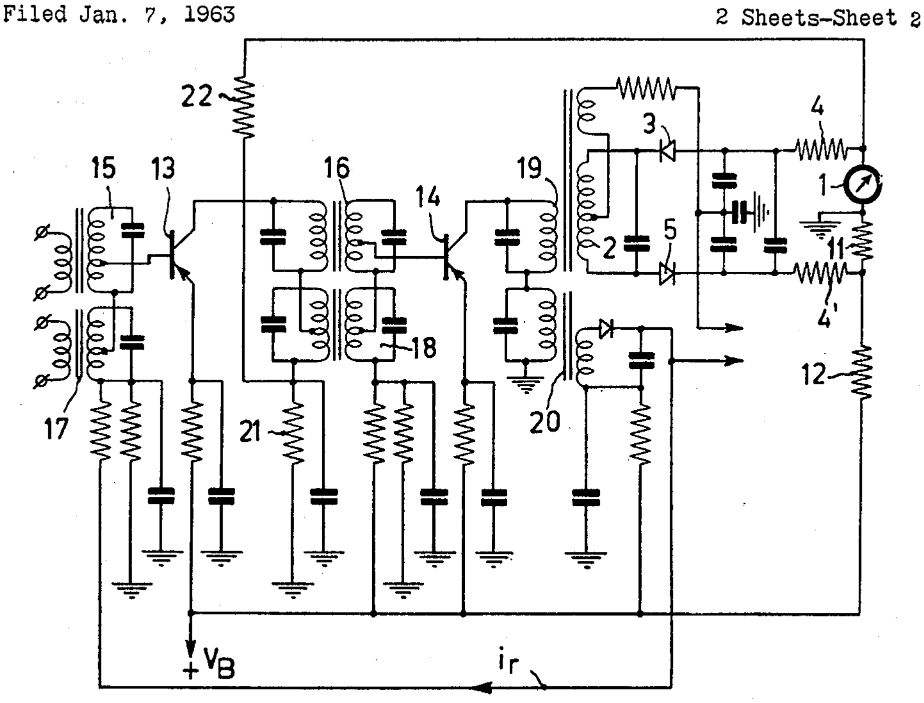
FIG. 3 shows a circuit according to the invention, including a symmetrical FM-detector in detail.

An arrangement including a symmetrical FM-detector is shown in FIG. 3 in which other circuit details of a receiver are also shown. Transistors 13 and 14 provide intermediate-frequency amplification in both AM- and FM-reception. Alternatively it would also be possible to provide two separate amplifiers, one for AM-reception and one for FM-reception. FM-intermediate-frequency filters are indicated by 15, 16 and AM-intermediate-frequency filters by 17, 18. The FM- and AM-detector filters are indicated by 19 and 20, respectively. The other circuit elements used for the direct-current automatic volume control and the alternating-current decoupling are convenitonal and are hence not provided with reference numerals.

In AM-reception, the intermediate-frequency amplifying transistor 13 is provided with automatic volume control. It will be evident that it would also be possible to control more than one transistor serving for intermediate-frequency amplification, or a transistor for the high-frequency amplification connected before the intermediate-frequency amplifier, and also transistors which serve for both intermediate-frequency amplification and high-frequency amplication. The amplification of transistor 13 is controlled by applying to its base the direct current $i_R$ from the AM-detector so that the collector current decreases with an increasing input signal. The transistor 14 is not controlled.

The circuit arrangement operates as follows. In AM-reception, the FM-detector 19 does not deliver direct current so that only the direct current from transistor 13, which is divided in a certain ratio by resistors 21 and 22, is active in the instrument 1. If the receiver is tuned to the frequency of an AM transmitter, this current decreases, due to the control by the direct current from the AM-detector, to a value dependent upon the strength of the transmitter signal. The collector current may decrease only to approximately zero. In FM-reception, the AM-detector 20 is not active so that transistor 13 is not controlled. The portion of the collector current flowing through resistor 22 keeps flowing, however, through the current coil of the indicating instrument 1 and hence also in FM-reception, the deflection of the instrument, if the receiver is not tuned to a transmitter, is equal to that in the non-controlled condition of AM-reception.

If the receiver is tuned to the frequency of an FM-transmitter, a direct current dependent upon the strength of the transmitter signal flows through the FM-detector. Since the two currents flowing through the instrument are oppositely directed by suitable connection of the FM-detector diodes 3 and 5, the deflection of the instrument becomes smaller and the tuning indication thus has the same direction in FM-reception as in AM-reception. Since the portion of the collector current which, in the non-controlled condition, flow through the instrument 1 is made equal by the resistors 21 and 22 to that value which flows in the direct-current circuit of the FM-detector for a maximum FM-signal, the deflection of the instrument for a maximum input signal approximately corresponds to the zero value also in FM-reception.

The voltage developed across the instrument 1 is compensated by means of a potentiometer 11, 12. In order not to disturb the symmetry of the FM-detector, the resistor 11 is chosen to be equal to the internal resistance of the indicating instrument. The total value of resistors 11 and 12, together with the supply voltage, determines the extent of compensation. The resistors 4 and 4′ constitute the load resistors of the symmetrical FM-detector.

Figure 4:
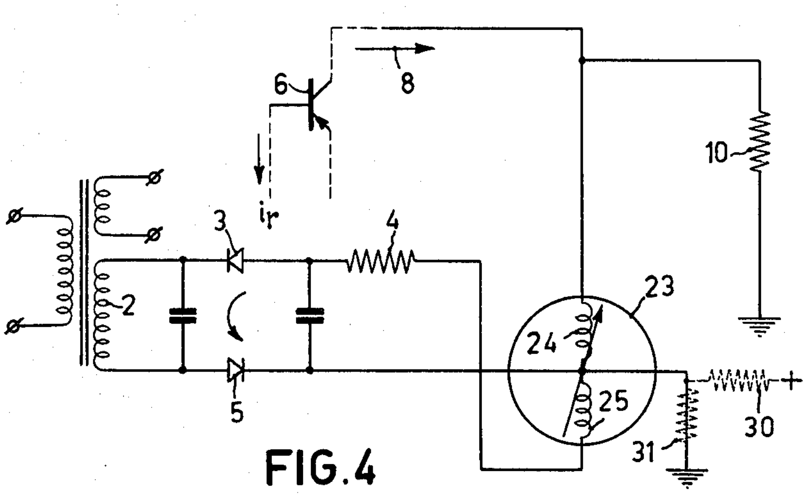
FIG. 4 shows a circuit arrangement, likewise with all superfluous details omitted, which includes a current-indicating instrument having two current coils.

The circuit diagram shown in FIG. 4 utilizes a current-indicating instrument having two windings, which affords the advantage that compensating steps are not necessary. The FM-detector produces a direct current 7 which flows through the secondary winding 2, the diodes 3 and 5 and the load resistor 4. An electrodynamic instrument 23 provided for tuning indication has two windings 24 and 25 which are included in the collector circuit of transistor 6 and the direct-current circuit of the FM-detector, respectively. The winding 25 is made active, or the diodes 3 and 5 are connected so that the current flowing through winding 25 causes a deflection of the instrument which is opposite to the deflection resulting from a flow of current through the winding 24. By varying resistor 10, which is connected in parallel with winding 24, or the series-resistor 4, which resistors may be adjustment controls, if desired, the measuring ranges associated with the two windings are variable. Resistor 10 may be dispensed with if the sensitivities of the windings 24 and 25 correspond to the currents to be indicated.

The operation is as follows. In AM-reception, the FM-detector does not deliver direct current so that the winding 24 only of the instrument 23 is active. When the receiver is not tuned to a transmiter the collector current of, for example, 1 ma. flows through transistor 6, which current corresponds to its normal working-point. If the receiver is tuned to a transmitter, this current decreases to a value dependent upon the strength of the transmitter due to the control by the direct current from the AM-detector. The collector current may decrease to almost zero. In FM-reception, the AM-detector is not active so that transistor 6 is not controlled and hence the collector current corresponding to the normal working-point flows through winding 24. Consequently, the deflection of the instrument during FM-reception, if the receiver is not tuned to a transmitter, is also equal to that in the non-controlled condition of AM-reception. If the receiver is tuned to an FM-transmitter, a direct current dependent upon the strength of the transmitter flows through the FM-detector. Since the winding 25 of the instrument is connected so that the action of the direct current upon the instrument is opposite to that of the collector current in the winding 24, which now conveys the constant no-load current of transistor 6, the deflection of the intstrument is likewise decreased and the tuning indication thus has the same direction as in AM-reception. If the numbers of turns of the two windings are chosen in inverse relationship to the current variations occurring in AM- and FM-reception when the tuned receiver is completely controlled, the instrument indicates the same deflection in both AM- and FM-reception when the receiver is properly tuned on a strong signal. If the collector current with AM-control decreases to zero, the ratio of the numbers of turns follows from the ratio between the non-controlled no-load current of the transistor and the maximum possible direct current of the FM-detector. In the circuit shown in FIG. 4 it is also possible to achieve, by adding two resistor 30 and 31, that the winding 24 does not convey current if an AM-input signal is absent or has a maximum amplitude, so that the maximum range of the instrumuent may be used for the tuning indication.

The present invention is applicable to receivers equipped with either pnp-type transistors or npn-type transistors, since the direction of the direct current in the FM-detector may be chosen freely by suitable connection of the diodes of the detector. The invention is also applicable with advantage to apparatus equipped, at least in part, with valves. Of course the invention is applicable to apparatus having a negative pole or a positive pole of the voltage supply source connected to earth potential.

If in the AM-reception, a plurality of stages are controlled, it is also possible for the instrument to be traversed by the sum of the currents or by a portion of the summation current obtained by division of current. If the resistors with which such division of current is obtained are of the variable type, the permit of compensating for divergences causes, for example, by the transistors of the instrument itself.

According to the invention, in case of battery receivers, the instrument may be provided with a mark at the position which the index occupies if the receiver is not tuned to a transmiter. Such a mark may be, for example, in the form of a specially coloured range of scale. Since the direct-voltage stabilization of a transistor controlled in AM-reception, since it has to be controllable, must not exceed a pre-determined value, a decrease in battery voltage also causes a decrease in the current, which flows through such a transistor in the absence of the control voltage and hence in the absence of a signal, and this current may thus serve as a measure of the battery voltage. The user of the apparatus may thus estimate from the position of the index within the indicated range of scale or relative to a mark in the form of a dash or point whether the batteries have to be replaced soon or not.

What is claimed is:

1. A tuning indicator circuit for a receiver of the type adapted to selectively receive amplitude modulated signals and frequency modulated signals, said circuit comprising a source of a first direct current that varies in amplitude as a function of only the received signal strength of amplitude modulated signals, a source of a second direct current that varies in amplitude as a function of only the received signal strength of frequency modulated signals, current indicating means, and means for continuously applying said first and second direct currents to said current indicating means, said source of said first direct current comprising an amplifier device connected as an automatic volume controlled stage for amplifying undemodulated received signals, said source of said second direct current comprising a frequency demodulator connected to demodulate said frequency modulated signals.

2. In a receiver of the type adapted to selectively receive amplitude modulated and frequency modulated signals, an amplifier device connected to amplify undemodulated signals, a source of an automatic volume control voltage responsive to the signal strength of received amplitude modulated signals, means applying said automatic volume control voltage to said amplifier device whereby a first direct current is produced in the output of said device and having an amplitude dependent upon the amplitude of said control coltage, a frequency demodulator circuit connected to demodulate received frequency modulated signals, said frequency demodulator circuit comprising means for producing a second direct current having an amplitude that varies with the signal strength of received frequency modulated signals, a current indicating device, and means for applying said first and second direct currents continuously to said current indicating device for indicating the tuning of said receiver.

3. A tuning indication circuit for a transistor receiver of the type adapted to selectively receive amplitude modulated and frequency modulated signals, said receiver comprising a source of automatic volume control voltage responsive to the signal strength of received amplitude modulated signals, a transistor connected as an amplifier for undemodulated signals, means applying said control voltage to said transistor whereby a first direct current flows in said transistor that has an amplitude dependent upon the amplitude of said control voltage, a frequency demodulator circuit for demodulating said frequency modulated signals, said demodulator circuit comprising a series circuit of first diode means, a source of frequency modulated signals, second diode means, and load means, in that order, whereby a second direct current flows in said series circuit that has an amplitude dependent upon the signal strength of received frequency modulated signals, said tuning indicating circuit comprising current indicating means, and means applying said first and second direct currents continuously to said current indicating means.

4. The circuit of claim 3, in which said current indicating means has first and second current windings, and means applying at least a portion of each of said first and second currents to said first and second windings respectively.

5. The circuit of claim 3, in which said current indicating means has a current winding, comprising means serially connecting said winding in said series circuit, and means applying at least a portion of said first current to said winding.

6. A tuning indication circuit for a transistor receiver of the type adapted to selectively receive amplitude modulated and frequency modulated signals, said receiver comprising a source of automatic volume control voltage responsive to the signal strength of received amplitude modulated signals, a transistor connected as an amplifier for undemodulated signals, means applying said control voltage to said transistor whereby the collector current of said transistor has an amplitude dependent upon the amplitude of said control voltage, a frequency demodulator for demodulating said frequency modulated signals, said demodulator circuit comprising a series circuit of first diode means, a source of frequency modulated signals, second diode means, and load means, in that order, whereby a second direct current flows in said series circuit that has an amplitude dependent upon the signal strength of received frequency modulated signals, said tuning indication circuit comprising current indicating means having first and second terminals connected serially in said circuit between said load means and said second diode means, a point of reference potential, means connecting the collector of said transistor to said first terminal, and means connecting said second terminal to said point of reference potential.

7. The circuit of claim 6, wherein said first and second diode means are connected in said series circuit with polarities such that variations of said second current in said current indicating means has the same sense with respect to variations in signal strength of said frequency modulated signals as variations in said collector current in said indicating means with respect to variations in the signal strength of said amplitude modulated signals.

8. The circuit of claim 6, comprising resistance means in series with said series circuit, and a source of potential connected to said resistance means, whereby said collector current is inhibited from flowing in portions of said series circuit other than said indicating means.

9. The circuit of claim 6, wherein said means connecting said first terminal to said collector comprises first resistance means, and further comprising second resistance means connected between said collector and said point of reference potential.

10. The circuit of claim 9, wherein said means connecting said second terminal to said point of reference potential comprises a source of potential.

11. A tuning indicator circuit for a receiver of the type adapted to selectively receive amplitude modulated signals and frequency modulated signals, said receiver further being of the type having an automatic volume controlled amplifier stage for undemodulated signals wherein a first direct current is produced having an amplitude dependent upon the signal strength of received amplitude modulated signals, said receiver still further being of the type having a frequency demodulator for demodulating said frequency modulated signals wherein a second direct current is produced having an amplitude dependent upon the signal strength of received frequency modulated signals, said tuning indicator circuit comprising current indicating means, means continuously applying said first and second direct currents to said indicating means in relative opposition whereby said indicating means indicated only variations in said first current when amplitude modulated signals are received and only variations in said second current when frequency modulated signals are received.

References Cited by the Examiner

UNITED STATES PATENTS 2,114,154 4/1938 Steimel ---------- 325—455
3,090,918 5/1963 Arguimbau ------- 325—315 X ROBERT H. ROSE, *Primary Examiner.*

DAVID G. REDINBAUGH, *Examiner.*

R. F. ROTELLA, R. LINN, *Assistant Examiners.*